(12) United States Patent
Sheu

(10) Patent No.: US 6,559,482 B1
(45) Date of Patent: May 6, 2003

(54) III-N COMPOUND SEMICONDUCTOR BIPOLAR TRANSISTOR STRUCTURE AND METHOD OF MANUFACTURE

(75) Inventor: Jinn-Kong Sheu, Jiang-Jiun Shiang (TW)

(73) Assignee: South Epitaxy Corporation, Tainan (TW)

( * ) Notice: Subject to any disclaimer, the term of this patent is extended or adjusted under 35 U.S.C. 154(b) by 0 days.

(21) Appl. No.: 10/115,756

(22) Filed: Apr. 3, 2002

(30) Foreign Application Priority Data

Dec. 31, 2001 (TW) ........................ 90133089 A

(51) Int. Cl.[7] ................ H01L 31/0328; H01L 31/0336
(52) U.S. Cl. ................ 257/197; 257/198; 257/200; 257/201; 438/235; 438/309; 438/312
(58) Field of Search ................ 257/197, 198, 257/571, 586, 445, 565, 576, 12, 11, 191, 200, 201, 183; 438/235, 309, 312, 317, 315, 319, 342, 343

(56) References Cited

U.S. PATENT DOCUMENTS 5,923,058 A * 7/1999 Agarwal et al. ............ 257/198
5,977,612 A * 11/1999 Bour et al. .................. 257/618

* cited by examiner

Primary Examiner—Tom Thomas
Assistant Examiner—Donghee Kang
(74) Attorney, Agent, or Firm—J.C. Patents

(57) ABSTRACT

A III-N compound semiconductor bipolar transistor structure and method of manufacture. An epitaxial layer structure is formed over a substrate. The epitaxial layer structure includes a nucleation layer, a buffer layer, an emitter layer containing first type dopants (conductive type) and a base layer containing second type dopants (conductive type). Ion implantation is conducted to form a first conductive region within the base layer for forming a collector terminal. A portion of the emitter layer is etched for forming an emitter terminal. In addition, two ion-implantation regions may form inside the base layer. The ion-implantation regions serve separately as the collector terminal and the emitter terminal of the bipolar transistor, respectively, so that a more planar transistor structure is formed.

23 Claims, 4 Drawing Sheets

US 6,559,482 B1

III-N COMPOUND SEMICONDUCTOR BIPOLAR TRANSISTOR STRUCTURE AND METHOD OF MANUFACTURE

CROSS-REFERENCE TO RELATED APPLICATION

This application claims the priority benefit of Taiwan application serial no. 90133089, filed Dec. 31, 2001.

BACKGROUND OF THE INVENTION

1. Field of Invention

The present invention relates to a III-N compound semiconductor device structure and method of manufacture. More particularly, the present invention relates to a III-N compound semiconductor heterojunction bipolar transistor (HBT) structure and method of manufacture.

2. Description of Related Art

Recent progress in semiconductor fabrication technologies has lead to the development of gallium nitride-based semiconductor devices such as gallium nitride (GaN), gallium aluminum nitride (GaAlN), and gallium indium nitride (GaInN) transistors. FIG. 1 is a schematic structural diagram of a conventional III-N compound semiconductor heterojunction bipolar transistor (HBT) structure.

As shown in FIG. 1, the heterojunction bipolar transistor is formed over a substrate 100 such as an aluminum oxide ($Al_2O_3$) substrate. A nucleation layer 102 and an intrinsic buffer layer 104 are formed in sequence over the substrate 100. The intrinsic buffer layer 104 can be undoped gallium nitride (GaN) layers, for example. A heavily N-doped gallium nitride ($n^+$—GaN) layer 106 is formed over the intrinsic buffer layer 104 serving as a collector contact layer in the HBT structure. A lightly N-doped gallium nitride ($N^-$—GaN) layer 108 and a P-doped gallium nitride layer 110 are formed in sequence over the intrinsic buffer layer 104. The P-doped gallium nitride layer 110 serves as a base in the HBT structure. A heavily N-doped aluminum gallium nitride ($n^+$—$Al_xGa_{1-x}N$) layer 112 and a heavily N-doped gallium nitride ($n^{30}$—GaN) layer 114 are formed in sequence over the P-doped gallium nitride layer 110. The heavily N-doped gallium nitride ($n^+$—GaN) layer 114 serves as an emitter contact layer in the HBT structure.

In the aforementioned HBT structure, each epitaxial layer is formed in sequence. To form various electrodes, a reactive ion etching (RIE) must be conducted to remove a portion of the epitaxial layer from the surface of the lower few layers so that the surface of those layers are exposed. Metallic contacts are formed over the exposed surface to serve as electrode terminals such as a base electrode B and a collector electrode C. However, after an RIE treatment of the P-doped gallium nitride layer 110 (that serves as a base for the HBT structure), a good ohmic contact between the metallic electrode B and the gallium nitride material layer 110 is hard to form.

In general, the activation energy of dopants in P-doped gallium nitride-based compound is low and the energy gap of the gallium nitride compound is wider than the conventional semiconductor material. Hence, high concentration of P-type carriers (hole) is difficult to obtain. In addition, because magnesium (Mg) and hydrogen (H) ions may combine to form Mg—H compound when P-type dopants are incorporated into a gallium nitride material layer, magnesium (Mg) is difficult to dissociate back into ions and release a hole carrier. Moreover, most RIE processes will damage the surface of a P-doped gallium nitride layer and produce nitrogen vacancies. These nitrogen vacancies are thought to be negatively charged defects that may combine with the holes in a P-type material and serve as a compensatory mechanism to reduce the total number of holes. In other words, hole concentration near the surface of P-type gallium nitride material layer is reduced after a RIE process. Ultimately, a good ohmic contact with a metallic layer is difficult to form.

In addition, the conventional method uses an etching process to expose the base and the collector region in a gallium nitride material layer in preparation for forming the base electrode B and the collector electrode C after the growth of epitaxial layers. Therefore, device surfaces are highly non-planar leading to greater difficulties in device integration.

SUMMARY OF THE INVENTION

Accordingly, one object of the present invention is to provide a III-N compound semiconductor heterojunction bipolar transistor (HBT) structure and method of manufacture. The method requires no reactive ion etching (RIE) process to expose a portion of the surface of a P-type gallium nitride material layer in order to form the base terminal of a HBT structure. Thus, the surface of the P-type gallium nitride layer is better preserved to form a metal electrode having a better ohmic contact.

A second object of this invention is to provide a III-N compound semiconductor bipolar transistor structure and method of manufacture capable of producing a device with planar surfaces so that subsequent device integration is facilitated.

To achieve these and other advantages and in accordance with the purpose of the invention, as embodied and broadly described herein, the invention provides a III-N compound semiconductor bipolar transistor structure over a substrate. The structure includes a nucleation layer, a buffer layer, an emitter structure layer, a base layer, an ion implant region, an emitter electrode, a base electrode and a collector electrode. The emitter structure layer further includes an emitter contact layer, a graded emitter layer and an emitter layer. The nucleation layer and the buffer layer are stacked in sequence on top of the substrate. The emitter structure layer containing first type dopants (conductive type) is located above the buffer layer. The base layer having second type dopants (conductive type) is above the emitter structure layer. The base layer also exposes a portion of the emitter contact layer. The ion implant layer is within the base layer. The ion implant layer is doped using dopants that differ from the second type dopants (conductive type) in the base layer. The emitter electrode is attached to the exposed surface of the emitter contact layer. The base electrode is attached to a portion of the surface of the base layer. The collector electrode is attached to the surface of the ion implant region. The emitter contact layer is above the buffer layer. The graded emitter layer is above the emitter contact layer and exposes a portion of the emitter contact layer. The emitter layer is between the graded emitter layer and the base layer.

This invention also provides an alternative III-N group compound based semiconductor bipolar transistor structure over a substrate. The structure includes a nucleation layer, a buffer layer, an emitter layer, a base layer, a first ion implant region, a second ion implant region, an emitter electrode, a base electrode and a collector electrode. The nucleation layer and the buffer layer are stacked in sequence on top of the substrate. The emitter layer having first type dopants (conductive type) such as N-type dopants is located above the buffer layer. The base layer having second type dopants (conductive type) such as P-type dopants is located above the emitter layer. The first and the second ion implant region are located within the base layer. The first ion implant layer is formed in the base layer having a depth of implant shallower than the thickness of the base layer. The first ion implant layer is doped using dopants that differ from the second type dopants (conductive type) in the base layer, that is, N-type dopants. The second ion implant region is buried within the base layer but has an implant depth greater than the thickness of the base layer and reaches the emitter layer. Similarly, the second ion implant layer is also doped using dopants that differ from the second type dopants (conductive type) in the base layer, that is, N-type dopants. The emitter electrode is above the second ion implant region, the base electrode is above the base layer and the collector electrode is above the first ion implant region.

This invention provides a method of forming a III-N compound semiconductor bipolar transistor structure. First, a substrate is provided. A nucleation layer and a buffer layer are sequentially formed over the substrate. An emitter structure layer is formed over the buffer layer. The emitter structure layer contains first type dopants (conductive type such as N-type). A base layer is formed in the emitter structure layer. The base layer contains second type dopants (conductive type such as P-type). An ion implant region is formed in the base layer. The ion implant region contains dopants that differ from the second type dopants (conductive type) in the base layer, that is, N-type dopants. A portion of the base layer and the emitter structure layer are removed to expose a portion of the emitter structure layer. An emitter electrode is formed on a portion of the exposed surface of the emitter structure layer. A base electrode is formed on a portion of the surface of the base layer. A collector electrode is formed on the surface of the ion implant region. In addition, the emitter structure layer includes an emitter contact layer, a graded emitter layer and an emitter layer. The step of forming the emitter structure layer further includes forming an emitter contact layer over the buffer layer, forming a graded emitter layer over the emitter contact layer and forming the emitter layer over the graded emitter layer.

This invention also provides an alternative method of forming a III-N semiconductor bipolar transistor structure. First, a substrate is provided. A nucleation layer and a buffer layer are sequentially formed over the substrate. An emitter layer is formed over the buffer layer. The emitter layer contains first type dopants (conductive type such as N-type). A base layer is formed over the emitter layer. The base layer contains second type dopants (conductive type such as P-type). A first ion implant region is formed in the base layer. The first ion implant region has an implant depth smaller than the thickness of the base layer. The first ion implant region contains dopants that differ from the second type dopants (conductive type) in the base layer, that is, N-type dopants. A second ion implant region is formed in the base layer. The second ion implant region has an implant depth greater than the thickness of the base layer and reaches the emitter layer. Similarly, the second ion implant region contains dopants that differ from the second type dopants (conductive type) in the base layer, that is, N-type dopants. Finally, a collector electrode, an emitter electrode and a base electrode are formed over a portion of the surface of the first ion implant region, the second ion implant region and the base layer respectively.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
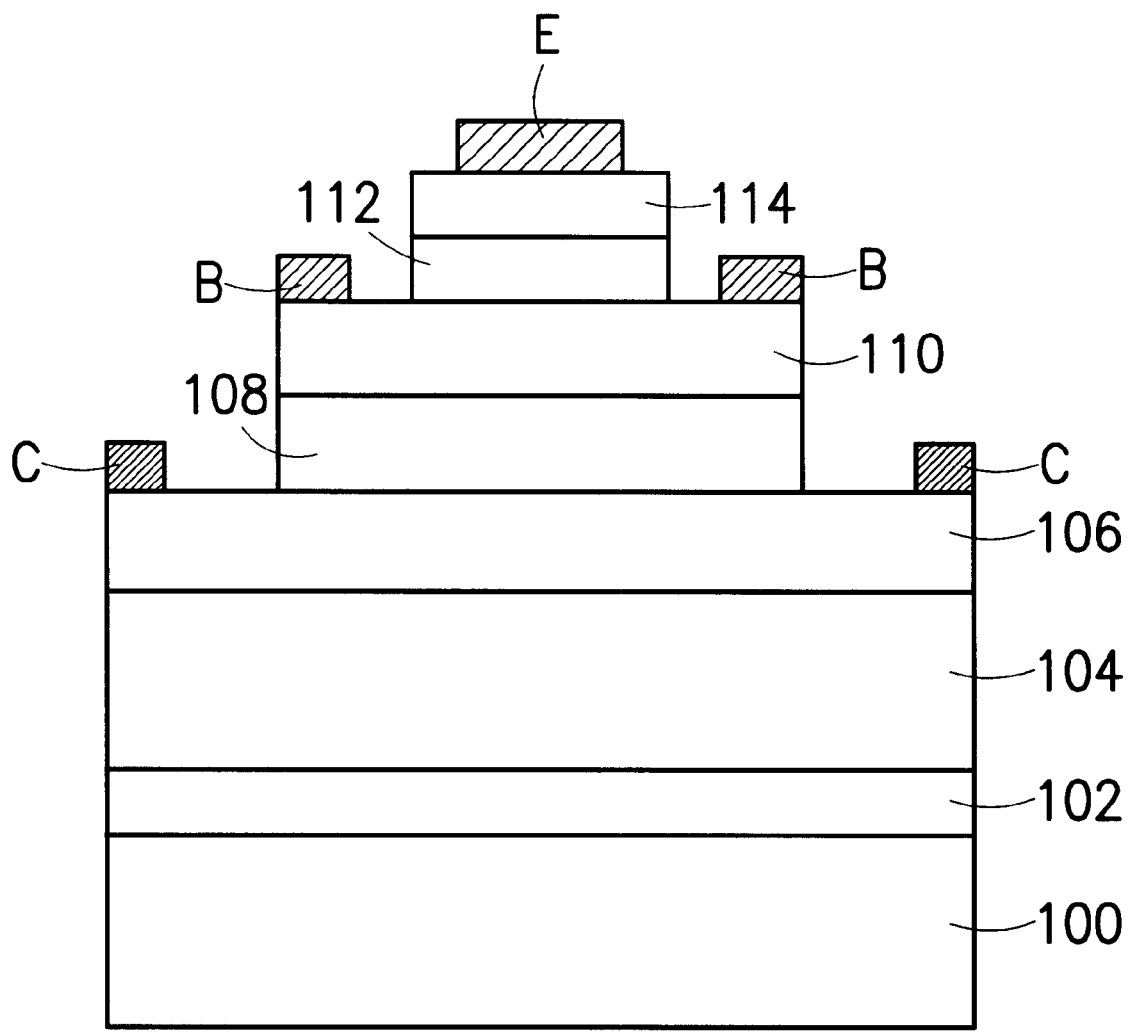
FIG. 1 is a schematic structural diagram of a conventional III-N compound semiconductor heterojunction bipolar transistor (HBT) structure.

Reference will now be made in detail to the present preferred embodiments of the invention, examples of which are illustrated in the accompanying drawings. Wherever possible, the same reference numbers are used in the drawings and the description to refer to the same or like parts.

The main concept behind this invention is to utilize an ion implantation to implant N-type ions into a P-doped material layer above an epitaxial layer to form an N-doped region that serves as a collector electrode or emitter electrode of the transistor. At least two types of transistor structures are possible. These two configurations are further explained with respect to FIG. 2 and FIG. 3 respectively.

Figure 2:
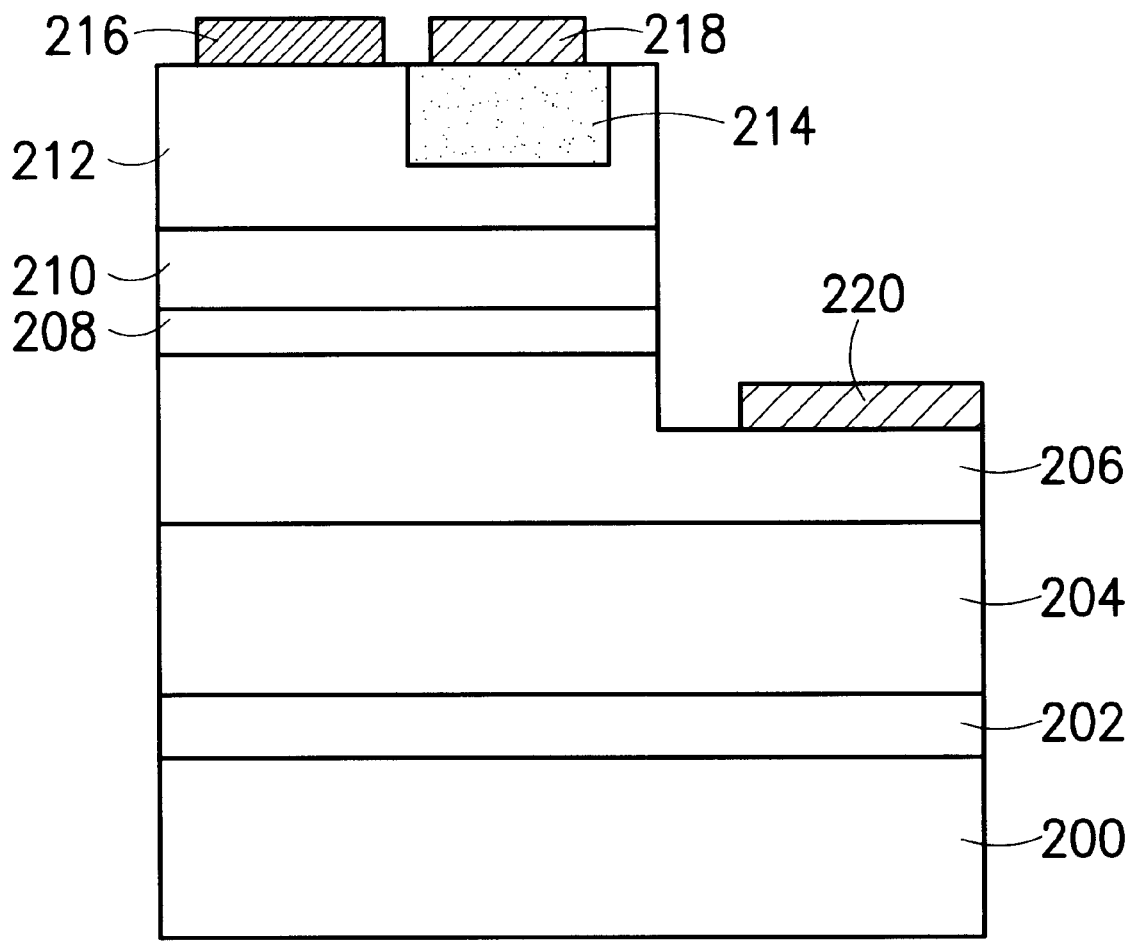
FIG. 2 is a schematic structural diagram of a III-N compound semiconductor HBT structure according to a first preferred embodiment of this invention.

FIG. 2 is a schematic structural diagram of a III-N compound semiconductor HBT structure according to a first preferred embodiment of this invention. As shown in FIG. 2, a substrate 200 is provided. The substrate 200 can be a sapphire, a silicon carbide (SiC), a zinc oxide (ZnO, a silicon (Si), a gallium phosphorus (GaP), a gallium arsenic (GaAs), an aluminum oxide ($Al_2O_3$) or some other suitable substrate. A nucleation layer 202 is formed over the substrate 200. The nucleation layer is, for example, an aluminum-indium-gallium nitride having a chemical formula $Al_uIn_vGa_{1-u-v}N$ ($u,v \geq 0; 0 \leq u+v \leq 1$).

An intrinsic buffer layer 204 is formed over the nucleation layer 202. The intrinsic buffer layer 204 is an undoped layer such as an aluminum-indium-gallium nitride layer having a chemical formula $Al_cIn_dGa_{1-c-d}N$ ($c,d \geq 0; 0 \leq c+d \leq 1$). In general, to grow a high-quality P-type or N-type gallium nitride based compound epitaxial layer over a substrate is relatively difficult. This is because the lattice constant of a P or N-type gallium nitride based semiconductor and the aforementioned substrate match up poorly. Hence, a nucleation layer 202 and buffer layer 204 each having a gallium nitride based compound semiconductor structure are formed over the substrate 200 to boost the quality of subsequently grown gallium nitride-based crystal and yield rate.

An emitter contact layer 206 is formed over the intrinsic buffer layer 204. The emitter contact layer 206 is an N-doped layer (heavily doped, $n^+$) such as an aluminum-indium-gallium nitride layer having a chemical formula $Al_cIn_dGa_{1-}$ $Al_cIn_dGa_{1-c-d}N$ (c,d≧0;0≦c+d≦1). An emitter electrode 220 is formed on an exposed surface of the emitter contact layer 206 in a subsequent process.

A graded emitter layer 208 is formed over the emitter contact layer 206. The graded emitter layer 208 is an N-doped layer (heavily doped, n$^+$) such as an aluminum-indium-gallium nitride layer having a chemical formula $Al_xIn_yGa_{1-x-y}N$ (x,y≧0;0≦x+y≦1;x>c). In other words, the aluminum and indium content within the N-doped layer varies as the material layer is grown so that the transistor has an optimal structural design. An emitter layer 210 is formed over the graded emitter layer 208. The emitter layer 210 is an emitter terminal of the heterojunction bipolar transistor (HBT). The emitter layer 210 is an N-doped layer (heavily doped, n$^+$) such as an aluminum-indium-gallium nitride layer having a chemical formula $Al_xIn_yGa_{1-x-y}N$ (x,y≧0;0≦x+y≦1;x>c).

A base layer 212 is formed over the emitter layer 210. The base layer 212 is a P-doped layer such as an aluminum-indium-gallium nitride layer having a chemical formula $Al_aIn_bGa_{1-a-b}N$ (a,b≧0;0≦a+b≦1;x>a). The base layer 212 is the uppermost layer among the epitaxial layers and a base terminal of the heterojunction bipolar transistor (HBT).

Figure 4:
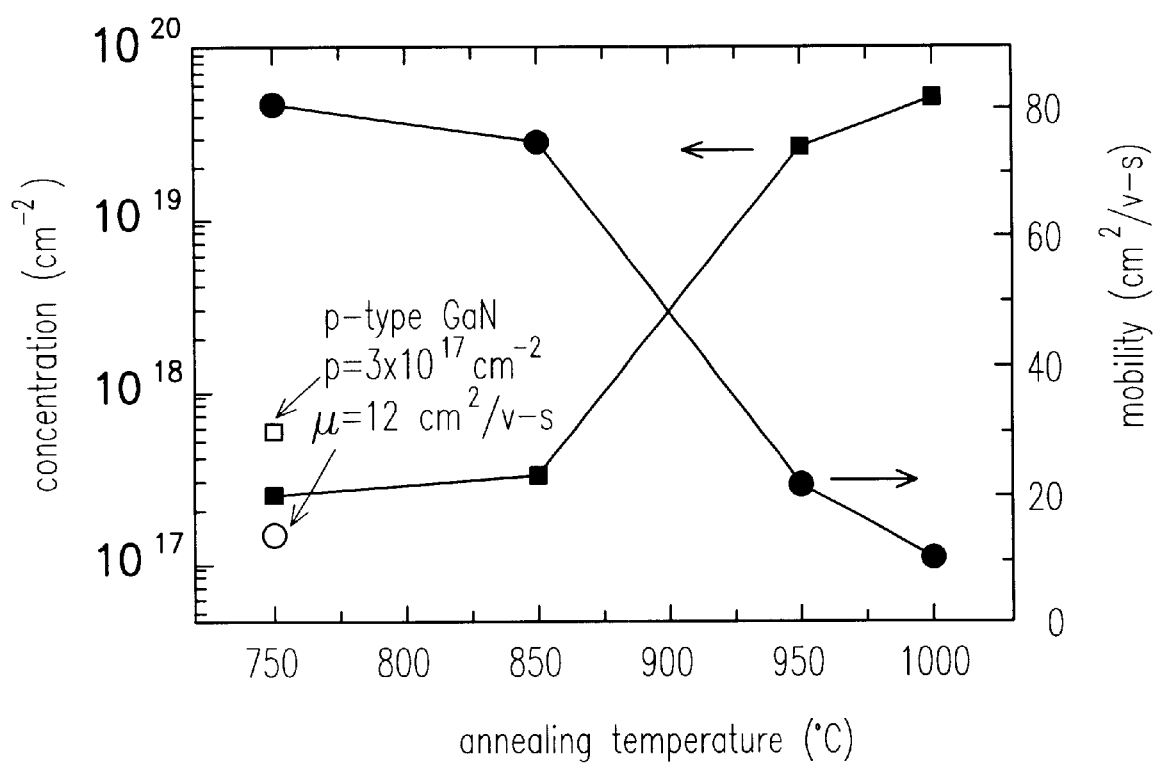
FIG. 4 is a graph showing the change in concentration and mobility of electrons versus annealing temperature for a silicon ion implanted P-type gallium nitride layer.

An ion implantation is carried out to implant N-type ions into a designated region of the base layer 212. The N-type ions implanted into the base layer 212 include ions of silicon (Si), selenium (Se), oxygen (O), tellurium (Te), germanium (Ge), tin (Sn) or sulfur (S). After implanting a suitable amount of N-type dopants into the base layer 212, a high temperature annealing process is conducted. These processes transform the implanted portion of the base layer 212 from a P-doped conductive type into an N-doped conductive type having a high concentration of electrons. FIG. 4 is a graph showing the change in concentration and mobility of electrons versus annealing temperature for a silicon ion implanted P-type gallium nitride layer. As shown in FIG. 4, P-type gallium nitride is transformed into N-type gallium nitride after a silicon (Si$^+$) ion implantation and an annealing treatment. Through ion implantation, the P-type gallium nitride having a hole concentration of about $3 \times 10^{17}/cm^3$ is converted to an N-type gallium nitride having an electron concentration of about $1 \times 10^{19}/cm^3$. The N-doped region 214 thus formed within the base layer 212 is a collector terminal of the heterojunction bipolar transistor (HBT).

A reactive ion etching (RIE) process is carried out to etch away a portion of the epitaxial layers 206, 208, 210 and 212 to expose a portion of the emitter contact layer 206. A metallic electrode 220 is formed on the exposed surface of the emitter contact layer 206. The metallic electrode 220 serves as an emitter terminal of the HBT structure. Similarly, a metallic electrode 216 is formed on the exposed surface of the base layer 212 to serve as a base terminal and another metallic electrode 218 is formed on the exposed surface of the N-doped region 214 to serve as a collector terminal. The collector electrode 218 and the emitter electrode 220 are made from metallic material such as Ti/Al/Ti/Au, Ti/Al/Pt/Au, Cr/Al/Pt/Au, Cr/Al/Ti/Au, Pd/Al/Ti/Au, Pd/Al/Pt/Au, Nd/Al/Pt/Au, Ad/Al/Ti/Au, NiAl/Ti/Au, NiAl/Pt/Au and NiAl/Cr/Au. The base electrode 216 is made from metallic material such as Ni/Au, Pd/Au and Ni/Pt/Au.

Accordingly, the collector terminal (the N-doped region 214) of this invention is formed by implanting N-type ions into P-doped material layer (the base layer) 212. Hence, the base metallic electrode can be directly attached to the P-doped material layer (the base layer) 212 instead of having to remove epitaxial layer through a RIE process in a conventional design. Therefore, this invention is able to prevent any damage to the P-doped layer due to RIE. Moreover, the metallic electrode 216 and the P-doped layer 212 are able to form a good ohmic contact.

Although the formation of the emitter electrode 220 involves removing material layers to expose a portion of the emitter contact layer 206 through an RIE operation so that some N-type material is also damaged, the overall number of electrons will remain. This is because, unlike a P-type material whose holes may be compensated by electrons (resulting from nitrogen vacancies due to RIE process) at the P-type material surface layer, surface concentration of electrons in the N-type material layer after an RIE operation will only drop a little. Consequently, the RIE treated surface of the N-doped material layer can still form good ohmic contact with metal.

In other words, the first embodiment eliminates the need to etch away the gallium nitride layer on the P-doped base layer of the HBT transistor structure. Hence, surface of the P-doped gallium nitride layer is in an ideal condition for forming a good ohmic contact with a metallic electrode.

Figure 3:
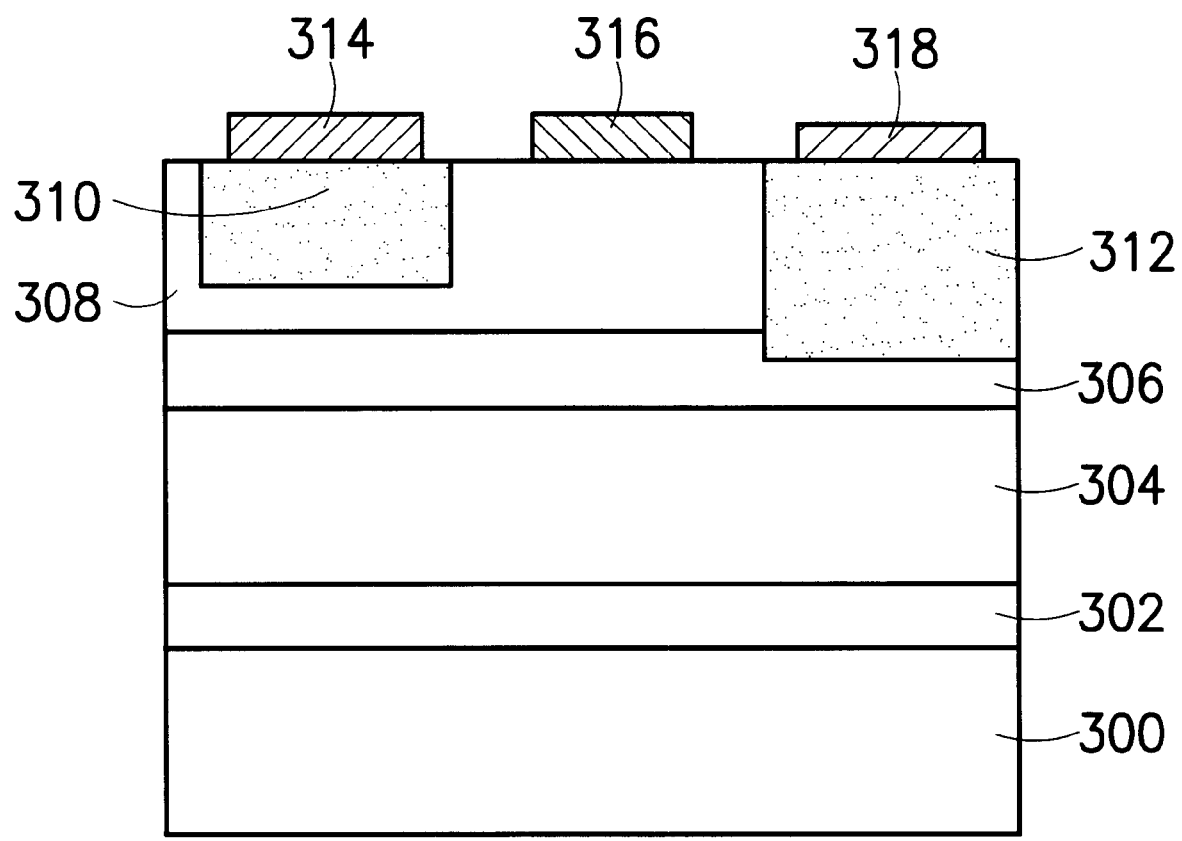
FIG. 3 is a schematic structural diagram of a III-N compound semiconductor HBT structure according to a second preferred embodiment of this invention.

FIG. 3 is a schematic structural diagram of a III-N compound semiconductor HBT structure according to a second preferred embodiment of this invention. As shown in FIG. 3, a substrate 300 is provided. The substrate 300 can be a sapphire layer, a silicon carbide (SiC), a zinc oxide (ZnO), a silicon (Si), a gallium phosphorus (GaP), a gallium arsenic (GaAs), an aluminum oxide ($Al_2O_3$) or some other suitable substrate. A nucleation layer 302 is formed over the substrate 300. The nucleation layer 302 is, for example, an aluminum-indium-gallium nitride having a chemical formula $Al_uIn_vGa_{1-u-v}N$ (u,v≧0;0≦u+v≦1).

An intrinsic buffer layer 304 is formed over the nucleation layer 302. The intrinsic buffer layer 304 is an undoped layer such as an aluminum-indium-gallium nitride layer having a chemical formula $Al_cIn_dGa_{1-c-d}N$ (c,d≧0;0≦c+d≦1). In general, to grow a high-quality P-type or N-type gallium nitride-based compound epitaxial layer over a substrate is relatively difficult. This is because the lattice constant of a P or N-type gallium nitride-based semiconductor and the aforementioned substrate match up poorly. Hence, a nucleation layer 302 and buffer layer 304 each having a gallium nitride-based compound semiconductor are formed over the substrate 300 to boost the quality of subsequently grown gallium nitride based compound and yield rate.

An emitter layer 306 is formed over the intrinsic buffer layer 304. The emitter layer 306 is an N-doped layer (heavily doped, n$^+$) such as an aluminum-indium-gallium nitride layer having a chemical formula $Al_xIn_yGa_{1-x-y}N$ (x,y≧0;0≦x+y≦1;x>c)

A base layer 308 is formed over the emitter layer 306. The base layer 308 is a P-doped layer such as an aluminum-indium-gallium nitride layer having a chemical formula $Al_uIn_vGa_{1-u-v}N$ (u,v≧0;0≦u+v≦1;u>a). The base layer 308 is the uppermost layer among the epitaxial layers (302, 304 and 306) and a base terminal of the heterojunction bipolar transistor (HBT).

Two separate ion implants are carried out to implant N-type ions into designated regions of the base layer 308 to form a first N-doped region 310 and a second N-doped region 312. The N-type ions implanted into the base layer 308 include ions of silicon (Si), selenium (Se), oxygen (O), tellurium (Te), germanium (Ge), tin (Sn) or sulfur (S). The first N-doped region 310 serves as a collector contact layer and the second N-doped region 312 serves as an emitter contact layer of the bipolar transistor structure. The first N-doped region 310 has an implant depth smaller than thickness of the P-doped layer (base terminal) 308. On the other hand, the second N-doped region 312 has an implant depth greater than the P-doped layer (base terminal) 308 and reaches into the N-doped emitter layer 306.

Metallic electrodes 314, 316 and 318 are formed on the exposed surface of the first N-doped region 310, the base layer 308 and the second N-doped region 312 respectively. The metallic electrodes 314, 316 and 318 are the collector terminal, the base terminal and the emitter terminal of the HBT structure. The collector electrode 314 and the emitter electrode 318 are made from metallic material such as Ti/Al/Ti/Au, Ti/Al/Pt/Au, Cr/Al/Pt/Au, Cr/Al/Ti/Au, Pd/Al/Ti/Au, Pd/Al/Pt/Au, Nd/Al/Pt/Au, Ad/Al/Ti/Au, NiAl/Ti/Au, NiAl/Pt/Au and NiAl/Cr/Au. The base electrode 316 is made from metallic material such as Ni/Au, Pd/Au and Ni/Pt/Au.

Accordingly, the collector terminal (N-doped region 310) and the emitter contact layer (N-doped region 312) are formed by implanting N-type ions into P-doped material layer (the base layer) 308. Hence, the base metallic electrode can be directly attached to the P-doped material layer (the base layer) 308 instead of having to remove epitaxial layer through an RIE process in a conventional design. Therefore, this invention is able to prevent any damages to the P-doped layer due to RIE. Moreover, the metallic electrode 316 and the P-doped layer 318 are able to form a good ohmic contact.

In conclusion, the III-N group compound-based semiconductor bipolar transistor structure has the following major advantages over a conventional bipolar transistor structure.

In a first embodiment of this invention, an ion implantation is utilized to form an N-doped region in the uppermost (P-type) epitaxial layer that serves as a collector terminal of the bipolar transistor structure. Consequently, there is no need to conduct an RIE operation to expose a portion of the P-doped gallium nitride material of the base layer. Without disturbing the crystal quality of the P-doped gallium nitride material, a better ohmic contact with metallic electrode can be produced.

In a second embodiment of this invention, two separate ion implant operations are conducted to form two N-doped regions in the uppermost (P-type) epitaxial layer. One N-doped region serves as an emitter contact layer while the other N-doped region serves as a collector terminal. Hence, RIE process is not required. Furthermore, the bipolar transistor structure has a planar surface so that subsequent device integration is very much facilitated.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A III-N compound semiconductor bipolar transistor structure, comprising:
   a substrate;
   a nucleation layer over the substrate;
   a buffer layer over the nucleation layer;
   an emitter structure layer over the buffer layer, wherein the emitter structure layer contains first type dopants (conductive type);
   a base layer over the emitter structure layer, wherein the base layer contains second type dopants (conductive type);
   an ion-implantation region within the base layer, wherein the implanted dopants inside the ion-implantation region differ from the second type dopants (conductive type) inside the base layer;
   an emitter electrode attached to the exposed surface of an emitter contact layer within the emitter structure layer;
   a base electrode attached to the upper surface of the base layer; and
   a collector electrode attached to the ion-implantation region.

2. The bipolar transistor structure of claim 1, wherein the emitter structure layer further includes:
   an emitter contact layer over the buffer layer;
   a graded emitter layer over the emitter contact layer, wherein the graded emitter layer exposes a portion of the emitter contact layer; and
   an emitter layer between the graded emitter layer and the base layer.

3. The bipolar transistor structure of claim 1, wherein the substrate material includes sapphire, silicon carbide (SiC), zinc oxide (ZnO), silicon (Si), gallium phosphorus (GaP) or gallium arsenide (GaAs).

4. The bipolar transistor structure of claim 1, wherein the buffer layer is an undoped intrinsic buffer layer.

5. The bipolar transistor structure of claim 1, wherein the nucleation layer includes a aluminum indium gallium nitride-based semiconductor material.

6. The bipolar transistor structure of claim 1, wherein the emitter structure layer includes a first type dopant (conductive type) doped gallium nitride-based semiconductor material.

7. The bipolar transistor structure of claim 1, wherein the first type dopants include N-type dopants.

8. The bipolar transistor structure of claim 1, wherein the base layer includes a second type dopant (conductive type) doped gallium nitride-based semiconductor material.

9. The bipolar transistor structure of claim 1, wherein the second type dopants include P-type dopants.

10. The bipolar transistor structure of claim 1, wherein the implanted ions inside the ion-implantation region include N-type ions.

11. The bipolar transistor structure of claim 1, wherein material constituting the base electrode, the collector electrode and the emitter electrodes includes a metal.

12. The bipolar transistor structure of claim 11, wherein metallic material for forming the collector electrode and the emitter electrode includes Ti/Al/Ti/Au, Ti/Al/Pt/Au, Cr/Al/Pt/Au, Cr/Al/Ti/Au, Pd/Al/Ti/Au, Pd/Al/Pt/Au, Nd/Al/Pt/Au, Nd/Al/Ti/Au, NiAl/Ti/Au, NiAl/Pt/Au and NiAl/Cr/Au, and metallic material for forming the base electrode includes Ni/Au, Pd/Au and Pt/Au.

13. A III-N compound based bipolar transistor structure, comprising:
   a substrate;
   a nucleation layer over the substrate;
   a buffer layer over the nucleation layer;
   an emitter layer over the buffer layer, wherein the emitter layer contains first type dopants (conductive type);
   a base layer over the emitter layer, wherein the base layer contains second type dopants (conductive type);
   a first ion-implantation region within the base layer, wherein the first ion-implantation region has a depth smaller than the thickness of the base layer, and the dopants (conductive type) inside the first ion-implantation region differ from the second type dopants (conductive type) inside the base layer;

a second ion-implantation region within the base layer, wherein the second ion-implantation region has a depth greater than the thickness of the base layer and reaches the emitter layer, and the dopants (conductive type) inside the second ion-implantation region differ from the second type dopants (conductive type) inside the base layer;

an emitter electrode on the second ion-implantation region;

a base electrode on the base layer; and a collector electrode on the first ion-implantation region.

14. The bipolar transistor structure of claim 13, wherein the substrate material includes sapphire, silicon carbide (SiC), zinc oxide (ZnO), silicon (Si), gallium phosphorus (GaP) or gallium arsenide (GaAs).

15. The bipolar transistor structure of claim 13, wherein the buffer layer is an undoped intrinsic buffer layer.

16. The bipolar transistor structure of claim 13, wherein the nucleation layer includes a aluminum indium gallium nitride-based semiconductor material.

17. The bipolar transistor structure of claim 13, wherein the emitter layer includes a first type dopant (conductive type) doped gallium nitride-based semiconductor material.

18. The bipolar transistor structure of claim 13, wherein the first type dopants include N-type dopants.

19. The bipolar transistor structure of claim 13, wherein the base layer includes a second type dopant (conductive type) doped gallium nitride-based semiconductor material.

20. The bipolar transistor structure of claim 13, wherein the second type dopants include P-type dopants.

21. The bipolar transistor structure of claim 13, wherein the implanted ions inside the first ion-implantation region and the second ion-implantation region include N-type ions.

22. The bipolar transistor structure of claim 13, wherein material constituting the base electrode, the collector electrode and the emitter electrode includes a metal.

23. The bipolar transistor structure of claim 22, wherein metallic material for forming the collector electrode and the emitter electrode includes Ti/Al/Ti/Au, Ti/Al/Pt/Au, Cr/Al/Pt/Au, Cr/Al/Ti/Au, Pd/Al/Ti/Au, Pd/Al/Pt/Au, Nd/Al/Pt/Au, Nd/Al/Ti/Au, NiAl/Ti/Au, NiAl/Pt/Au and NiAl/Cr/Au, and metallic material for forming the base electrode includes Ni/Au, Pd/Au and Pt/Au.

* * * * *